(12) United States Patent
Linga et al.

(10) Patent No.: US 7,023,024 B2
(45) Date of Patent: Apr. 4, 2006

(54) DIAMOND BASED BLUE/UV EMISSION SOURCE

(75) Inventors: Krishna Linga, Plainsboro, NJ (US); Ranjit Pandher, Dover, DE (US)

(73) Assignee: Inphot, Inc., Plainsboro, NJ (US)

( * ) Notice: Subject to any disclaimer, the term of this patent is extended or adjusted under 35 U.S.C. 154(b) by 59 days.

(21) Appl. No.: 10/814,710

(22) Filed: Mar. 31, 2004

(65) Prior Publication Data

US 2005/0224782 A1    Oct. 13, 2005

Related U.S. Application Data

(60) Provisional application No. 60/298,835, filed on Mar. 31, 2003.

(51) Int. Cl.
*H01L 33/00*    (2006.01)
(52) U.S. Cl. .......................... 257/101; 257/14; 257/94; 257/103
(58) Field of Classification Search ...................... None
See application file for complete search history.

(56) References Cited

U.S. PATENT DOCUMENTS

2005/0164482 A1*    7/2005    Saxler .................. 438/604

* cited by examiner

*Primary Examiner*—Tu-Tu Ho

(57) ABSTRACT

A diamond based Blue/UV light emitting source is disclosed. The source includes a diamond substrate having a first conductivity type, a first aluminum gallium nitride layer above the diamond substrate having the same conductivity type as the substrate, a bulk or a quantum well structure on the AlGaN layer formed of a plurality of repeating sets of alternating layers selected from among GaN, InGaN, and AlInGaN, a second AlGaN layer on the quantum well or the bulk active layer having the opposite conductivity type as the first AlGaN layer, a contact structure on the second AlGaN layer having the opposite conductivity type from the substrate and the first AlGaN layer, an ohmic contact to the diamond substrate, and an ohmic contact to the contact structure.

63 Claims, 2 Drawing Sheets

DIAMOND BASED BLUE/UV EMISSION SOURCE

CROSS REFERENCE TO RELATED APPLICATIONS

This application claims benefit under 35 U.S.C. 119(e) from U.S. Provisional Application No. 60/298,835 filed on Mar. 31, 2003.

FEDERALLY SPONSORED RESEARCH OR DEVELOPMENT

None.

BACKGROUND OF THE INVENTION

1. Field of the Invention

The present invention relates to light emitting diodes (LEDs) and in particular relates to a light emitting diode formed from diamond substrate and Group III nitrides that emit in the blue and ultraviolet (UV) portion of the electromagnetic spectrum.

2. Description of the Related Art

A light emitting diode is formed of one or more semiconductor materials that includes at least one p-n junction (the diode) and which emits light (photons) of a particular color when current passes (is injected) through the device.

Because light emitting diodes are formed from semiconductor materials, they represent one group of "solid state" devices; i.e., those electrical or electronic devices formed in solid compositions, and that operate without the use of flow of electrons through a gas or a vacuum that characterized a much earlier generation of electronic equipment such as vacuum tubes. In an increasingly large number of electronic applications, solid-state devices are overwhelmingly preferred because of their relatively low cost, high reliability, small size, lightweight, and the derivative advantages that these provide.

In particular, light emitting diodes have become almost ubiquitous in their appearance in devices of all types. In recent years, the availability of light emitting diodes that will emit in the blue portion of the visible spectrum has expanded yet again the available applications for light emitting diodes. In addition to providing blue light per se, blue LEDs with the appropriate wavelengths (about 455–492 nanometers), can be incorporated with LEDs of the other primary colors (red and green, both of which have generally been more widely available than blue) to form multiple combinations of visible colors for many purposes. Indeed, the availability of all three primary colors in light emitting diodes has opened the possibility for solid-state production of white light (i.e., the combination of all the primary colors), and such devices are increasingly available in the consumer marketplace as well as other areas of commerce.

The color that an LED produces is based on a number of factors, but primarily depends upon the bandgap of the semiconductor material being used, often combined with various doping schemes, including compensated doping schemes. The material being used is the fundamental factor, however, because the material's full bandgap represents the limiting factor in the energy transitions that can produce a photon. Thus, materials with smaller bandgaps cannot produce photons having sufficient energy (and corresponding wavelength and frequency) to fall into the higher energy (blue and violet) portion of the visible spectrum. In particular, in order to produce a blue photon, a material must have a band gap of at least 2.5 eV (e.g. for a 492 nm photon), and only a relatively few semiconductor materials meet this criteria. Among these are the Group III nitrides, silicon carbide (SiC), and diamond.

Although much interest and success in blue LEDs has focused upon silicon carbide based devices, Group III nitrides have raised more recent and greater interest because of their characteristics as direct rather than indirect emitters. In somewhat simplistic terms, a direct emitter produces a photon that incorporates all of the energy of the bandgap transition, while an indirect emitter emits some of the transition energy as a photon and some as vibrational energy (a phonon). Thus, a direct transition is more efficient than an indirect one in an LED. Additionally, the bandgap of Group III nitride materials can be tailored somewhat by the atomic composition of the nitride. Thus, blue light emitting diodes are generally formed in combinations of gallium nitride, aluminum nitride, indium nitride, and various ternary and tertiary versions of these materials. In particular, indium gallium nitride is an attractive candidate because its bandgap can be tuned by adjusting the amount of indium present.

Although the blue LED has expanded the universe of LED applications, its use can be to some extent limited in producing white light for other, more mundane reasons. For example, in order to produce white light from the red-green-blue combination, a lamp or pixel must incorporate a red LED, a blue LED and a green LED. Additionally, producing the necessary circuitry and physical arrangements to house and operate three LEDs is more complex than for single-color LEDs when they are incorporated into devices.

Accordingly, recent interest has focused upon the use of single color LEDs in combination with fluorescent and phosphorescent materials to produce desired colors from single LEDs. Although many materials respond in fluorescent or phosphorescent fashion to light in the visible spectrum, and thus will respond to visible LEDs, more tend to respond to the higher-energy photons in the ultraviolet portion of the spectrum. Furthermore, certain visible LED-phosphor combinations raise particular disadvantages. For example, a relatively high energy photon from a blue LED will produce phosphorescence in a number of materials, including phosphorescence of white light. Because the blue LED is stimulating the phosphorescence, however, the light always tends to have a blue component in it that may be undesired in a given application.

Accordingly, the use of ultraviolet (UV) LED and high brightness blue LEDs as the excitation source for fluorescent or phosphorescent lighting has become of greater interest. In theory, a single UV LED that produces an appropriate wavelength and frequency emission can produce a suitable white light emission from a complementary phosphor. Producing and improving light emitting diodes that can emit in an efficient and satisfactory manner in the UV and Blue portion of the spectrum remains a desirable goal.

What is required is a light emitting diode that can produce frequencies in the ultraviolet and blue portion of the electromagnetic spectrum and that can be incorporated into related devices and equipment, including devices that use phosphors in combination with the LED to produce white light.

BRIEF DESCRIPTION OF THE DRAWINGS

The foregoing and other objects and advantages of the invention and the manner in which the same are accomplished will become clear based on the followed detailed description taken in conjunction with the accompanying drawings in which.

SUMMARY OF THE INVENTION

An object of the present invention is to provide a light emitting diode that can produce frequencies in the ultraviolet and blue portion of the electromagnetic spectrum and that can be incorporated into related devices and equipment, including devices that use phosphors in combination with the LED to produce white light.

In another aspect, the invention is the combination of the LED with an appropriate phosphor to produce a device that emits white light.

In yet another aspect, the invention is a method of producing the UV and high brightness Blue light emitting diode.

The present invention generally relates to a device design and process details for a light source in the blue and ultraviolet domain based on the unique properties of diamond. Use of diamond as a semiconductor material and formation of heterostructures for an efficient generation of light at short wavelength is presented. Diamond is the hardest material, has high thermal conductivity, has very low coefficient of thermal expansion and has a large band gap. These unique properties make diamond a potential high performance semiconductor devices material. However, diamond has some challenges as far as the impurity doping and making ohmic contacts is concerned. In this invention, we provide two different ways to exploit the unique properties of diamond as a material for high end LED's and lasers in the blue/ultraviolet domain.

A diamond based Blue/UV light emitting source is disclosed. The source includes a diamond substrate having a first conductivity type, a first aluminum gallium nitride layer above the diamond substrate having the same conductivity type as the substrate, a bulk or a quantum well structure on the AlGaN layer formed of a plurality of repeating sets of alternating layers selected from among GaN, InGaN, and AlInGaN, a second AlGaN layer on the quantum well or the bulk active layer having the opposite conductivity type as the first AlGaN layer, a contact structure on the second AlGaN layer having the opposite conductivity type from the substrate and the first AlGaN layer, an ohmic contact to the diamond substrate, and an ohmic contact to the contact structure.

Advantages of the present invention include low cost, high reliability, small size, light weight, and improved heat dissipation.

DESCRIPTION OF THE INVENTION

Figure 1:
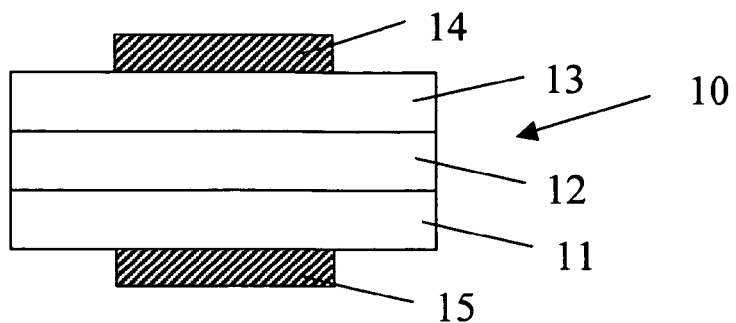
FIG. 1 is a schematic diagram of a light-emitting diode in its basic form as exemplified by the prior art.

Referring to FIG. 1, a schematic cross sectional diagram of a simple conventional LED in the prior art is shown. The LED 10 is formed of a substrate 11, and then respective n and p-type epitaxial layers 12 and 13 that form the p-n junction. Ohmic contacts 14 and 15 complete the device in situations where the substrate 11 is conductive. In a device using silicon carbide, the substrate 11 is typically n-type as is the first epitaxial layer 12. The top epitaxial layer 13 is p-type. One of the advantages of silicon carbide as a substrate is its capability of being conductively doped to thus permit the vertical orientation of the device illustrated in FIG. 1. As used in this art, the term "vertical" indicates that the ohmic contacts 14 and 15 are placed at opposite ends of the device so that current can flow through the device in end-to-end fashion rather than laterally, as in LED's that incorporate non-conductive substrates such as sapphire. In its simplest operation, when current is passed through the LED 10, holes and electrons from the layers 12 and 13 combine and give off energy in the form of photons. When the bandgaps or other aspects of the device, such as compensated doping, define the proper energy separations, the photons will be in the visible portion of electromagnetic spectrum and thus form visible light. In the same manner, of course, smaller-energy transitions can produce lower-energy photons that fall into the infrared portion of the spectrum, and larger-energy transitions can, as in the present invention, produce higher-energy photons that fall into the blue, violet, and ultraviolet portions of the spectrum.

Figure 2:
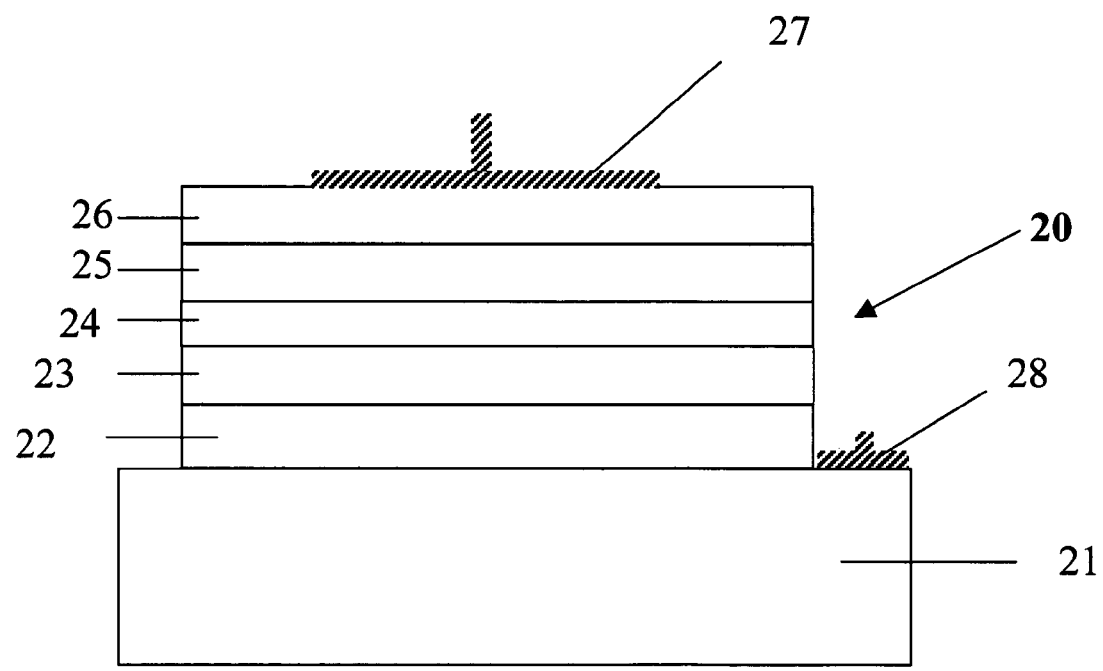
FIG. 2 is a schematic cross-sectional view of the light-emitting diode of the present invention using diamond substrate.

Referring now to FIG. 2, a schematic illustrates the present invention in cross sectional fashion and generally designated at 20. In a broad overview, the device 20 is formed on a diamond substrate 21. In preferred embodiments, the substrate 21 is formed either from the bulk single crystal substrate or by CVD deposition method with most preferred for its better electrical and optical proprieties.

The substrate 21 carries an aluminum gallium nitride (AlGaN) buffer layer 22 that provides a crystal and electronic transition between the diamond substrate 21 and its lattice parameters and those of the remainder of the device. As used herein, the formula AlGaN represents the more complete designation $Al_xGa_{1-x}N$ in which 1>x>0. Although the buffer layer 22 forms an element of a preferred embodiment of the invention, it is an optional element.

The graded buffer layers of AlGaN 23 functions to reduce the propagation of dislocations in the crystal that tend to originate in the diamond substrate 21. Such dislocations tend to propagate through Group III nitride layers. In practice, the graded buffer layers 23 can reduce the defect density. Thus, although the AlGaN buffer layers are not a required element of the invention, it does form an element of the preferred embodiment.

The next layer is an indium gallium nitride (InGaN) layer 24 which is doped with silicon to be n-type, and permitting the overall vertical orientation of the device 20.

Figure 4:
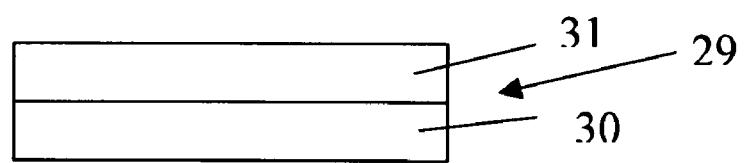
FIG. 4 is schematic cross-sectional view of the multi-quantum well layers.

The next portions of the device are the multiple quantum well 29 active layer instead of the single InGaN layer 24 by it self designated at 29 as will be discussed in more detail with respect to FIG. 4.

In preferred embodiments, the layer 29 includes both a doped and undoped portion. The doped portion is n-type and about 250 A° thick and is immediately adjacent the buffer layer 22. The undoped portion is about 35 A° thick and preferably borders the MQW 29. Avoiding doping this portion of layer 29 helps protect the InGaN portion of the first period of the multiple quantum well 29 from undesired doping.

The multiple quantum well 29 is capped by another aluminium gallium nitride layer 25, which in preferred embodiments is undoped but can be n-doped with silicon. The next layer is a n-type GaN contact layer 26. Ohmic contacts 27 to the n-type contact layer 26 and 28 to the substrate 21 respectively, complete the device. The contact layer 26 is preferably formed of GaN because it provides a better ohmic contact than AlGaN. The preferred GaN contact does not limit the contact to GaN, a suitable InGaN or superlattice layers are also possible contact layers.

In preferred embodiments, the quantum well 29 is formed of a plurality of repeating sets ("periods") of alternating layers of indium gallium nitride (InGaN) 30 and gallium nitride 31, respectively. In other embodiments, the alternating layers can both be InGaN, with different mole fraction combinations of indium and gallium. In yet another embodiment, the alternating layers can be AlGaInN with different mole fractions of aluminum, gallium and indium.

To some extent, the advantages provided by the quantum well 29 are empirically observed rather than theoretically understood. Thus, Applicants do not wish to be bound by any particular theory about the quantum well, but have determined that the resulting light emitting diode demonstrates improved performance, particularly brightness, when the quantum well 29 is included. The quantum well 29 also increases the effective carrier concentration and reduces the voltage required for the device, thus improving both its optical quality and the efficiency.

A multiple quantum well includes a number of repetitions of a basic structure formed of a layer of undoped indium gallium nitride, 30, and layers of gallium nitride 31. The indium gallium nitride portions 30 are undoped and, having the smallest bandgap of all of the materials in the device, form the quantum well 29 in which the carrier density is highest. Although the inventors do not wish to be bound by any particular theory, it appears that undoped InGaN tends— all other factors being equal—to be of higher quality than doped InGaN. Thus undoped InGaN represents the presently preferred embodiment of the invention, but is not an absolute limitation.

Furthermore, although the periods formed of GaN and InGaN represent the preferred and illustrated embodiment, it will be understood that in a broader sense the alternating layers can be expressed as $In_xG_{1-x}N$ alternating with $In_yG_{1-y}N$ where $1>X>0$ and $1>Y>0$ or alternatively a quaternary $Al_xIn_yGa_{1-x-y}N$ where $X+Y<1$. In such cases, the values of X and Y are selected to make sure that the quantum wells 30 have smaller bandgaps than the layers 31.

In preferred embodiments, each of the gallium nitride layer 31 is formed of three respective portions. A first portion is not intentionally doped. A second portion is n-type doped with silicon. A third portion is not intentionally doped. The purpose of intentionally doped layers of first and third is to provide an undoped region immediately adjacent the undoped indium gallium nitride well layer 30.

In some cases, a single quantum well is advantageous and can form the active layer of the present invention, i.e, where the light is produced. The use of a plurality of quantum wells 30, however, rather than a single quantum well, helps collect and in effect use, as many available carriers as possible thus increasing the efficiency of the device in comparison to a single layer structure of the same material. At some point, however, after most of the carriers have been collected, additional wells will no longer provide a proportional increase in efficiency. Additionally, indium gallium nitride is a strained crystal structure relative to gallium nitride and even though the layers are relatively thin, the strain in the multiple quantum well becomes cumulative. Thus the number of quantum wells is generally selected as sufficient to increase the efficiency while less than the number at which the strain would become troublesome, and the gain in efficiency would likewise become minimal or nonexistent. Presently, successful devices have been formed using a three-period well, a five-period well and a seven-period well, and those of skill in the art will be able to select other numbers of periods without departing from the scope of the invention or the claims.

Lesser fractions of indium cause the device to emit a shorter wavelength, higher frequency photon in the desired UV range. Accordingly, in preferred embodiments of the invention, X is equal to about 0.15; i.e., $In_{0.15}Ga_{0.85}N$.

In order to produce a UV or blue emission, the percentage, mole fraction, of indium in the InGaN quantum wells 30 is preferably no more than 30% and most preferably about 15%. Similarly, the thickness of the wells is preferably no more than about 50 angstroms.

The resulting LEDs that have been produced with wavelengths between 370 nm and 460 nm depending upon the design parameters set forth herein.

Figure 3:
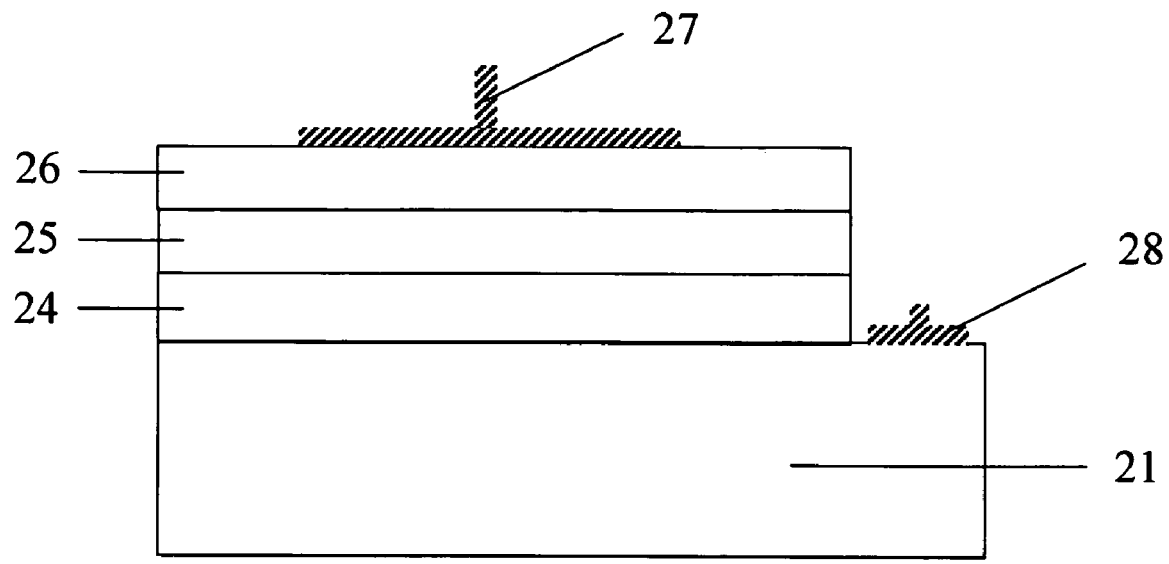
FIG. 3 is another schematic example of the present invention.

Referring now to FIG. 3, a schematic illustrates the present invention in cross sectional fashion and generally designated at 40. In a broad overview, the device 40 is formed on a diamond substrate 21. In preferred embodiments, the substrate 21 is formed from the bulk single crystal substrate with most preferred for its better electrical and optical proprieties.

The next layer is an indium gallium nitride (InGaN) layer 24, which is doped with silicon to be n-type, and permitting the overall vertical orientation of the device 40. This active layer forms the p-n junction using the diamond substrate 21 as the 'p' type semiconducting layer.

As discussed earlier, the InGaN active layer can be replaced by multiple quantum well 29 active layer instead of the single InGaN layer 24 by it self designated at 29 as was discussed in detail earlier.

METHOD ASPECTS OF THE INVENTION

There are a number of distinct steps in producing the light emitting diode of the present invention. As is understood in the art, the growth of epitaxial layers of materials such as Group III nitrides is a relatively sophisticated task. To some extent, the particular growth conditions and techniques are dependent upon factors such as the particular reactors and related facilities and equipment being used. Thus, the description herein provides the information necessary to carry out the disclosed and claimed techniques under individual or different circumstances.

The first step is to grow the AlGaN buffer layer on the substrate 21. The composition of the AlGaN layer is $Al_xGa_{1-x}N$ in which $1>X>0$, with X being between about 5 and 15 in preferred embodiments.

The Group III nitrides are preferably grown using metal-organic chemical vapor deposition, also referred to as MOCVD. The general nature of MOCVD is well understood in the art and the steps recited herein can accordingly be practiced by those of ordinary skill in this art without undue experimentation. As noted earlier, the sophisticated nature of the technique will, however, normally require specific adjustments based on individual equipment and set-ups.

Following completion of the AlGaN buffer layer 22, the graded layers of AlGaN are grown on the buffer layer 22 at a temperature of about 700° C. The temperature should be low enough to help control, and in particular slow, the growth rate and thus control the quality and thickness of the graded layers. Temperatures of about 700° C. are preferred. At higher temperatures, the layer tends to form more quickly making the growth and thickness somewhat, but not excessively, more difficult to control.

Following the growth of the buffer layer 22, and the graded layers 23, the indium gallium nitride n-type layer 24 is grown using a series of steps. As upward growth from the buffer layer 22 proceeds adjacent the AlGaN buffer layer. Because defects tend to propagate more easily vertically than horizontally, the lateral portions, and the vertical growth that follows, tend to exhibit reduced defect density.

As in preferred embodiments the quantum wells includes between about 2 and 10 periods (10 periods being exemplary) formed by the indium gallium nitride layer 30, and the gallium nitride layer 31, both of which are doped n-type with silicon (Si). If desired, however, layers 30 and 31 can be undoped.

Following growth of the quantum well 29, the n-type aluminium gallium nitride layer 25 is grown in two steps. The first portion of layer 25 having a thickness of about 250 A° grown with silicon doping at a temperature of about 820° C. A smaller, narrower portion of the layer is then grown without doping to help make sure that the undoped indium gallium nitride layer in the multiple quantum well 29 is segregated as much as possible from the silicon doping in the n-type layer.

The multiple quantum well 29 is grown in the following fashion. First, the relatively thin, approximately 25 A°, undoped indium gallium nitride layer 30 is grown at a temperature of 770° C. following which a relatively thin undoped portion of GaN of about 25 A° is grown also at 770° C. This is followed by a silicon doped portion of gallium nitride that is grown at the somewhat higher temperature of 820° C. to help increase the crystal quality of the gallium nitride. Stated differently, for gallium nitride layers above or near to indium gallium nitride layers, somewhat lower temperatures are preferred to protect the indium gallium nitride layers. Whenever possible, however, the gallium nitride is preferably grown at a somewhat higher temperature to improve its crystal quality.

In a functional sense, the temperatures used can be described as follows. The InGaN is grown at a first temperature that is low enough to incorporate the desired, but not an excessive, amount of indium, while high enough to get high quality growth for the amount of indium desired.

Next, a GaN layer is grown at this same first temperature to thereby cover the InGaN without undesirably heating the InGaN above the first temperature.

Next, the GaN layer is extended by growth at a second temperature that is higher than the first temperature. The second temperature is selected to be high enough to encourage higher quality growth of the GaN, but low enough to avoid degrading the nearby, though nonadjacent, InGaN well.

Next, another portion of the gallium nitride layer of approximately 35 A° is grown at the 840° C. temperature, but without doping for the same reasons stated earlier; i.e., to protect the next InGaN layer from unintentional doping. After the appropriate number of quantum wells are included, the quantum well portion is finished with one final well of indium gallium nitride layer of about 25 A° thickness, again grown at about 770° C., and one final relatively thin layer of undoped gallium nitride, also grown at 770° C. to a thickness of about 25 A°.

Following completion of the multiple quantum well 29, the undoped AlGaN layer 25 is grown at a temperature of about 820° C. and forms the cap on the last well. In an alternative embodiment, the GaN layer 25 can be doped with magnesium or silicon.

Finally, the n-type GaN contact layer 26 is formed to a thickness of about 1800 A° at a temperature of about 980° C., again representing a somewhat higher temperature to improve the growth and crystal quality while refraining from overheating the InGaN portions of the device. The n-GaN contact layer 26 is likewise doped with silicon. The n-type layers 25 and 26 provide the hole injection required for operation of the device. Although the preferred embodiment incorporates n-AlGaN and n-GaN for layers 25 and 26 respectively, these layers can be formed of the other Group III nitrides provided that they are incorporated in a manner consistent with the structure and function of the overall device.

In another aspect, the invention is a light emitting device that incorporates the UV and blue LED with an appropriate phosphor to produce a desired visible output. Materials that fluoresce or phosphoresce in response to UV radiation (regardless of source) are generally well known in the relevant arts. For example, common fluorescent lights operate on the same principle; i.e., a portion of the bulb or fixture generates a UV emission that in turn excites a phosphor that emits visible white light. Exemplary phosphors that produce white (or near-white) emission in response to UV radiation are generally well known and understood in this art, and can be selected and incorporated without undue experimentation. Furthermore, it will be understood that although white light is an exemplary goal, other colors can be produced in this manner using other relevant phosphors, and the invention is not limited to the production of white light.

What is claimed is:

1. A light emitting diode comprising:
   (a) a diamond substrate;
   (b) a first aluminum gallium nitride layer above said diamond substrate having same conductivity type as said substrate;
   (c) a quantum well structure on said first aluminum gallium nitride layer formed of a plurality of repeating sets of alternating layers selected from the group consisting of GaN, $In_xGa_{1-x}N$, where $0<x<1$, and $Al_x In_yGa_{1-x-y}N$ where $0<x<1$ and $0<y<1$ and $0<x+y<1$;
   (d) a second aluminum gallium nitride layer on said quantum well structure having conductivity type opposite of said first aluminum gallium nitride layer;
   (e) a contact structure on said second aluminum gallium nitride layer having conductivity type opposite of said substrate and said first aluminum gallium nitride layer;
   (f) an ohmic contact to said diamond substrate; and
   (g) an ohmic contact to said contact structure.

2. The light emitting diode of claim 1 wherein said diamond substrate is a single crystal or CVD deposited diamond.

3. The light emitting diode of claim 1 wherein said diamond substrate is a semiconducting substrate for desired absorption in the Blue and ultraviolet wavelengths.

4. The light emitting diode of claim 1 wherein said diamond substrate and said first aluminum gallium nitride layer have p-type conductivity.

5. The light emitting diode of claim 1 further comprising:
   (h) a buffer layer on said diamond substrate for providing a crystal and electronic transition between said substrate and the remainder of said LED.

6. The light emitting diode of claim 5 wherein said buffer layer is $Al_xGa_{1-x}N$ where $1 \geq x \geq 0$.

7. The light emitting diode of claim 5 further comprising:
   (i) a plurality of graded layers of $Al_xGa_{1-x}N$ where $1>x>0$ on said quantum well or bulk active layer and said buffer layer for reducing propagation of defects that tend to originate in said substrate.

8. The light emitting diode of claim 1 wherein said quantum well comprises a plurality of periods of alternating layers of GaN and $In_xGa_{1-x}N$ where $0<x<1$.

9. The light emitting diode of claim 1 wherein said quantum well includes between 2 and 20 periods of said alternating layers.

10. The light emitting diode of claim 8 wherein said $In_xGa_{1-x}N$ layers and said GaN layers are doped n-type.

11. The light emitting diode of claim 1 wherein said quantum well comprises a plurality of periods of alternating layers of $In_xGa_{1-x}N$ and $In_yGa_{1-y}N$, where $0<x<1$ and $0<y<1$ and x does not equal y.

12. The light emitting diode of claim 1 wherein said quantum well is formed of a plurality of periods of alternating layers of $Al_xGa_{1-x}N$ and $Al_yGa_{1-y}N$, where $0<x<1$ and $0<y<1$ and x does not equal y.

13. The light emitting diode of claim 1 wherein said second aluminum gallium nitride layer comprises a doped portion and an undoped portion for protecting said multiple quantum well from undesired doping.

14. The light emitting diode of claim 13 wherein said doped portion of said first aluminum gallium nitride layer is immediately adjacent to said quantum well and said undoped portion of said second aluminum gallium nitride layer is immediately adjacent to said multiple quantum well.

15. The light emitting diode of claim 1 wherein said multiple quantum well comprises a plurality of repetitions of a basic structure formed of a layer of $In_xGa_{1-x}N$, where $0<x<1$ and a layer of GaN.

16. The light emitting diode of claim 15 wherein at least one of said $In_xGa_{1-x}N$ layers is undoped.

17. The light emitting diode of claim 1 wherein said multiple quantum well comprises alternating layers of $In_xGa_{1-x}N$ and $In_yGa_{1-y}N$, where $1>x>0$ and $1>y>0$ and where x does not equal y.

18. The light emitting diode of claim 17 wherein at least one of said $In_xGa_{1-x}N$ and said $In_yGa_{1-y}N$ layers is undoped.

19. The light emitting diode of claim 1 wherein said multiple quantum well comprises alternating layers of $In_xGa_{1-x}N$ where $0<x<1$ and $Al_xIn_yGa_{1-x-y}N$, where $0<x<1$ and $0<y<1$ and $0<x+y<1$.

20. The light emitting diode of claim 19 wherein at least one of said $In_xGa_{1-x}N$ layers is undoped.

21. The light emitting diode of claim 15 wherein x is equal to about 0.15 in said alternating $In_xGa_{1-x}N$ layers.

22. The light emitting diode of claim 15 wherein at least one of said GaN layers in said multiple quantum well comprises a first portion of doped GaN and a second portion of undoped GaN with said undoped portion being immediately adjacent to at least one of said undoped $In_xGa_{1-x}N$ layers.

23. The light emitting diode of claim 1 wherein said multiple quantum well includes at least three quantum wells.

24. The light emitting diode of claim 1 wherein said multiple quantum well includes at least five quantum wells.

25. The light emitting diode of claim 1 wherein said multiple quantum well includes at least seven quantum wells.

26. The light emitting diode of claim 23 wherein a thickness of each said well is no more than about 100 Angstroms.

27. The light emitting diode of claim 23 wherein a thickness of each said well is about 50 Angstroms.

28. The light emitting diode of claim 15 wherein $0<x<0.3$ in said $In_xGa_{1-x}N$ layers in said multiple quantum well.

29. The light emitting diode of claim 15 wherein $0<x<0.15$ in said $In_xGa_{1-x}N$ layers in said multiple quantum well.

30. The light emitting diode of claim 15 wherein x is such that said multiple quantum well produces a photon in ultraviolet or blue region of an electromagnetic spectrum.

31. The light emitting diode of claim 17 wherein x and y are such that said multiple quantum well produces a photon in ultraviolet or blue region of an electromagnetic spectrum.

32. The light emitting diode of claim 18 wherein x is such that said multiple quantum well produces a photon in ultraviolet or blue region of an electromagnetic spectrum.

33. The light emitting diode of claim 1 wherein said multiple quantum well emits a peak wavelength between about 370 nanometers and 470 nanometers.

34. The light emitting diode of claim 1 wherein said contact structure comprises a n-type GaN contact layer.

35. The light emitting diode of claim 34 wherein said contact structure further comprises:
(h) at least one layer of $Al_xGa_{1-x}N$ where $0<x<1$ adjacent to said n-type GaN contact layer and opposite to said ohmic contact with respect to said n-type contact layer.

36. The light emitting diode of claim 34 wherein said contact structure comprises an undoped $Al_xGa_{1-x}N$ layer, where $0<x<1$, on said third GaN layer and a n-type $Al_xGa_{1-x}N$ layer, where $0.1>x>1$, on said undoped $Al_xGa_{1-x}N$ layer.

37. The light emitting diode of claim 1 wherein said third layer of GaN is doped with magnesium to produce a p-type conductivity.

38. The light emitting diode of claim 1 wherein said third layer of GaN is doped with silicon to produce an n-type conductivity.

39. The light emitting diode of claim 4 wherein said contact structure comprises a n-type layer of $Al_xGa_{1-x}N$, where $0<x<1$.

40. The light emitting diode of claim 4 wherein said contact structure comprises a p-type contact to diamond substrate.

41. The light emitting diode of claim 4 wherein said contact structure comprises a n-type Group III nitrides.

42. The light emitting diode of claim 1 wherein said multiple quantum well emits in ultraviolet and blue portion of an electromagnetic spectrum further comprising:
(h) a phosphor responsive to ultraviolet radiation that produces a visible photon in response to an ultraviolet photon emitted by said multiple quantum well.

43. A method of fabricating a light emitting diode, comprising the steps of:
(a) growing a first aluminum gallium nitride layer on a diamond substrate having conductivity type of said substrate;
(b) growing a quantum well structure of active layer on said first aluminum gallium nitride layer comprising a plurality of repeating sets ("periods") of alternating layers selected from the group consisting of GaN, $In_xGa_{1-x}N$ where $0<x<1$, and $Al_xIn_yGa_{1-x-y}N$ where $x+y<1$;
(c) growing a second aluminum gallium nitride layer on said quantum well structure having conductivity type opposite of said first aluminum gallium nitride layer;
(d) growing a contact structure on said second aluminum gallium niride layer having conductivity type opposite of said diamond substrate and forming an ohmic contact to said diamond substrate; and
(e) forming an ohmic contact to said contact structure.

44. The method of fabricating a light emitting diode of claim 43 wherein said layers formed of Group III nitrides are grown using metal-organic chemical vapor deposition.

45. The method of fabricating a light emitting diode of claim 43 further comprising the steps of:
(f) growing an $Al_xGa_{1-x}N$ buffer layer on said diamond substrate to a thickness of about 3,000 Angstroms at a temperature of about 1,000° C.; and
(g) thereafter growing said first aluminum gallium nitride layer on said $Al_xGa_{1-x}N$ buffer layer.

46. The method of fabricating a light emitting diode of claim 45 further comprising the step of:
(h) growing graded layers of $Al_xGa_{1-x}N$ on said buffer layer over a temperature range of 200–1000° C. so as to reduce defect migration to said active layer.

47. The method of fabricating a light emitting diode of claim 46 further comprising the step of:
(i) growing said graded layers of $Al_xGa_{1-x}N$ on said buffer layer at a temperature of about 700° C.

48. The method of fabricating a light emitting diode of claim 43 further comprising the steps of:
(f) growing the first aluminum gallium nitride layer on said substrate to a thickness of about 30,000 Angstroms at temperature of about 1,090° C. such that a lateral growth rate of said first aluminum gallium nitride layer is greater than its vertical growth rate;
(g) reducing temperature to about 1,030° C. for a period of time as said aluminum gallium nitride layer grows and thereafter to about 790° C. for a period of time; and
(h) reducing temperature gradually during final phase of growth of said aluminum gallium nitride layer to about 770° C. in order to prepare for growth of said $In_xGa_{1-x}N$ multiple quantum well.

49. The method of fabricating a light emitting diode of claim 43 wherein the step of fabricating said quantum wells comprises growing alternating layers of $In_xGa_{1-x}N$ and GaN and doping both alternating layers with silicon to produce a n-type conductivity.

50. The method of fabricating a light emitting diode of claim 43 further comprising the step of growing undoped layers of $In_xGa_{1-x}N$ and GaN.

51. The method of fabricating a light emitting diode of claim 43 further comprising the step of forming between two and ten said quantum wells of alternating layers.

52. The method of fabricating a light emitting diode of claim 43 further comprising the step of forming said second GaN layer with a first portion having a thickness of about 250 Angstroms at a temperature of about 820° C. and doping the second GaN layer with silicon.

53. The method of fabricating a light emitting diode of claim 43 further comprising the steps of forming said second GaN layer with a second, narrower portion at a temperature of about 820° C. and without doping to thereby separate an undoped $In_xGa_{1-x}N$ layer in said multiple quantum well from a doped portion of said second GaN layer.

54. The method of fabricating a light emitting diode of claim 43 wherein the step of fabricating said multiple quantum well comprises the steps of: growing an undoped layer of $In_xGa_{1-x}N$ to a thickness of about 50 Angstroms at a first temperature of about 770° C.; growing an undoped layer of GaN on said undoped layer of $In_xGa_{1-x}N$ to a thickness of about 50 Angstroms at a temperature of about 770° C.; growing another layer of GaN at a temperature of about 820° C., and doping said layer with silicon to help improve the conductivity of said GaN; growing another undoped layer of GaN at a temperature of about 770° C.; extending said undoped GaN layer by growing it at a second temperature higher than about 770° C., said second temperature being high enough to promote higher quality growth of said GaN, but low enough to avoid degrading said nearby, non-adjacent $In_xGa_{1-x}N$ well; and growing a final portion of said undoped layer of GaN to a thickness of about 35 Angstroms at a temperature of about 840° C.

55. The method of fabricating a light emitting diode of claim 54 comprising repeating the steps of fabricating said multiple quantum well at least three times in order to fabricate three quantum wells.

56. The method of fabricating a light emitting diode of claim 54 comprising repeating the steps of fabricating said multiple quantum well at least five times in order to fabricate five quantum wells.

57. The method of fabricating a light emitting diode of claim 54 comprising repeating the steps of fabricating said multiple quantum well at least seven times in order to fabricate seven quantum wells.

58. The method of fabricating a light emitting diode of claim 54 wherein fabricating said multiple quantum well comprises growing a final well of $In_xGa_{1-x}N$ at a temperature of about 770° C. to a thickness of about 50 Angstroms and growing a final layer of undoped GaN at a temperature of about 770° C. to a thickness of about 35 Angstroms.

59. The method of fabricating a light emitting diode of claim 54 further comprising the step of growing said third GaN layer on said multiple quantum well at a temperature of about 820° to a thickness of about 100 Angstroms.

60. The method of fabricating a light emitting diode of claim 59 further comprising the step of doping said third GaN layer with magnesium to produce p-type conductivity.

61. The method of fabricating a light emitting diode of claim 59 further comprising the step of doping said third GaN layer with silicon to produce n-type conductivity.

62. The method of fabricating a light emitting diode of claim 43 wherein the step of fabricating said contact structure comprises the steps of: growing a first undoped $Al_xGa_{1-x}N$ layer at a temperature of about 890° C. to a thickness of about 50 Angstroms; growing a silicon doped layer of $Al_xGa_{1-x}N$ with n-type conductivity at a temperature of about 890° C. to a thickness of about 100 Angstroms; and growing a GaN contact layer doped with silicon to have a n-type conductivity at a temperature of about 980° C. to a thickness of about 2000 Angstroms.

63. The method of fabricating a light emitting diode of claim 62 wherein said n-type layers of said contact structure are fabricated using materials selected from the group of $Al_xGa_{1-x}N$, $In_xGa_{1-x}N$ and GaN, where 0<x<1, as substitutes for said doped layer of $Al_xGa_{1-x}N$ and said doped layer of GaN.

* * * * *